United States Patent
Nakagawa

(10) Patent No.: US 9,324,575 B2
(45) Date of Patent: Apr. 26, 2016

(54) PLASMA ETCHING METHOD AND PLASMA ETCHING APPARATUS

(71) Applicant: TOKYO ELECTRON LIMITED, Tokyo (JP)

(72) Inventor: Akira Nakagawa, Beaverton, OR (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/638,393

(22) Filed: Mar. 4, 2015

(65) Prior Publication Data

US 2015/0255305 A1 Sep. 10, 2015

(30) Foreign Application Priority Data

Mar. 4, 2014 (JP) ................... 2014-042172
Sep. 4, 2014 (JP) ................... 2014-180073

(51) Int. Cl.
| | | |
|---|---|---|
| G01L 21/30 | (2006.01) | |
| G01R 31/00 | (2006.01) | |
| H01L 21/311 | (2006.01) | |
| H01J 37/32 | (2006.01) | |
| H01L 21/67 | (2006.01) | |

(52) U.S. Cl.
CPC ..... *H01L 21/31144* (2013.01); *H01J 37/32027* (2013.01); *H01J 37/32082* (2013.01); *H01J 37/32091* (2013.01); *H01J 37/32137* (2013.01); *H01J 37/32146* (2013.01); *H01J 37/32449* (2013.01); *H01J 37/32697* (2013.01); *H01L 21/31116* (2013.01); *H01L 21/67069* (2013.01)

(58) Field of Classification Search
CPC ................ H01L 21/31144
USPC ............ 216/61; 438/714; 156/345.28, 345.24
See application file for complete search history.

(56) References Cited

U.S. PATENT DOCUMENTS

| | | | |
|---|---|---|---|
| 2008/0233757 A1* | 9/2008 | Honda | H01J 37/32091 438/711 |
| 2010/0213162 A1 | 8/2010 | Mochiki et al. | |
| 2011/0244691 A1 | 10/2011 | Mochiki et al. | |
| 2014/0144876 A1 | 5/2014 | Nakagawa et al. | |

FOREIGN PATENT DOCUMENTS

| | | |
|---|---|---|
| JP | 2010-219491 A | 9/2010 |
| WO | 2013/018776 A1 | 2/2013 |
| WO | 2013/125523 A1 | 8/2013 |

OTHER PUBLICATIONS

English machine translation of WO 2013/125523, published Aug. 29, 2013 (28 pages).

* cited by examiner

*Primary Examiner* — Roberts Culbert
(74) *Attorney, Agent, or Firm* — Rothwell, Figg, Ernst & Manbeck, P.C.

(57) ABSTRACT

In a plasma etching method for forming a hole in an etching target film, a process of generating a plasma of a processing gas containing at least $C_xF_y$ gas and a rare gas having a mass smaller than a mass of Ar gas into the processing chamber in the processing chamber by switching on a high frequency power application unit under a first condition and a process of extinguishing the plasma of the processing gas in the processing chamber by switching off the high frequency power application unit under a second condition are alternately repeated. A negative DC voltage from a DC power supply is applied such that an absolute value of the negative DC voltage of the second condition becomes greater than an absolute value of the negative DC voltage of the first condition.

10 Claims, 11 Drawing Sheets

PLASMA ETCHING METHOD AND PLASMA ETCHING APPARATUS

CROSS-REFERENCE TO RELATED APPLICATIONS

This application claims priority to Japanese Patent Application Nos. 2014-042172 and 2014-180073 filed on Mar. 4, 2014 and Sep. 4, 2014, respectively, the entire contents of which are incorporated herein by reference.

FIELD OF THE INVENTION

The present invention relates to a plasma etching method and a plasma etching apparatus.

BACKGROUND OF THE INVENTION

Conventionally, in a semiconductor device manufacturing process, there has been employed a plasma etching method for performing etching by acting a plasma on a substrate (e.g., a semiconductor wafer) provided in a processing chamber. For example, in the semiconductor device manufacturing process, the plasma etching method has been used to form a contact hole in a silicon dioxide film or the like. Recently, it is required to form a contact hole having a fine diameter and a high aspect ratio (HARC (High Aspect Ratio Contact)) while suppressing occurrence of bowing in which a hole diameter becomes larger and maintaining a vertical sidewall shape thereof.

Japanese Patent Application Publication No. 2010-219491 discloses a technique for forming a hole having a high aspect ratio by etching an etching target film at a high etching rate while ensuring a good etching shape. In this technique, there is used a gas containing a halogen-containing gas represented by a fluorocarbon gas ($C_xF_y$) such as $C_4F_8$ gas or the like and additionally containing another gas such as Ar gas, $O_2$ gas or the like. Further, a DC voltage is applied to an upper electrode of a plasma etching apparatus, and an ArF photoresist that is an organic film having a low etching resistance is modified by injecting high-speed electrons into a semiconductor wafer.

However, in the technique disclosed in Japanese Patent Application Publication No. 2010-219491, if the etching is continued, bowing occurs in the hole of the etching target film due to insufficient emission of secondary electrons and the high aspect ratio. In view of the above, the disclosure provides a technique for further suppressing occurrence of bowing.

SUMMARY OF THE INVENTION

In a plasma etching method disclosed herein, a hole is formed in an etching target film by using a plasma etching apparatus including: an evacuable processing chamber configured to accommodate a processing target object; a lower electrode, provided in the processing chamber, serving as a mounting table for the processing target object; an upper electrode provided in the processing chamber to face the lower electrode; a processing gas supply unit configured to supply a processing gas containing at least $C_xF_y$ gas and a rare gas having a mass smaller than a mass of Ar gas into the processing chamber; a high frequency power application unit configured to apply a high frequency power for plasma generation to at least one of the upper electrode and the lower electrode; and a DC power supply configured to apply a negative DC voltage to the upper electrode. In the method disclosed herein, the etching target film is etched to form a hole therein by alternately repeating a process of generating a plasma of the processing gas supplied into the processing chamber by switching on the high frequency power application unit under a first condition and a process of extinguishing the plasma of the processing gas in the processing chamber by switching off the high frequency power application unit under a second condition, and applying the negative DC voltage from the DC power supply such that an absolute value of the negative DC voltage of the second condition becomes greater than an absolute value of the negative DC voltage of the first condition.

In accordance with various aspects and embodiments of the present invention, occurrence of bowing can be further suppressed.

DETAILED DESCRIPTION OF THE EMBODIMENTS

Hereinafter, a plasma etching method and a plasma etching apparatus according to embodiments will be described in detail with reference to the accompanying drawings. The present invention is not limited to such embodiments. The embodiments may be optimally combined within the scope that does not contradict the processing content. Hereinafter, the embodiments will be described in detail with reference to the accompanying drawings.

First Embodiment

Figure 1:
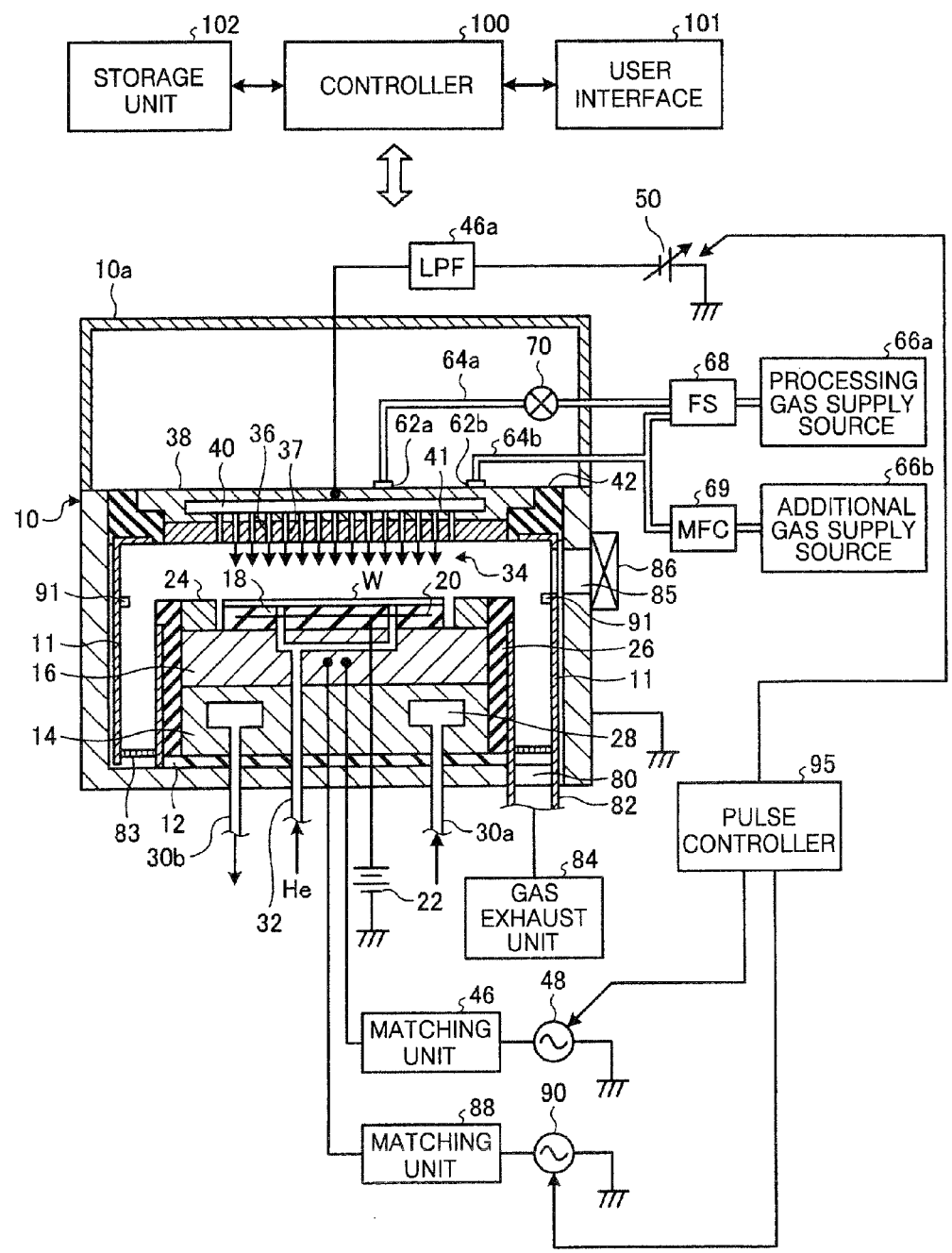
FIG. 1 is a schematic cross sectional view showing an example of a plasma etching apparatus capable of performing a plasma etching method according to a first embodiment of the present invention.

FIG. 1 is a schematic cross sectional view showing an example of a plasma etching apparatus capable of performing a plasma etching method according to a first embodiment of the present invention.

The plasma etching apparatus is configured as a capacitively coupled parallel plate type plasma etching apparatus. The plasma etching apparatus includes a substantially cylindrical chamber (processing chamber) 10 having a surface made of anodically oxidized aluminum. The chamber 10 is frame grounded.

A columnar susceptor support 14 is provided at a bottom portion of the chamber 10 via an insulating plate 12 made of ceramic or the like. A susceptor 16 made of, e.g., aluminum, is provided on the susceptor support 14. The susceptor 16 serves as a lower electrode and a semiconductor wafer W as a processing target substrate is mounted thereon.

Provided on top of the susceptor 16 is an electrostatic chuck 18 for attracting and holding the semiconductor wafer W with an electrostatic force. The electrostatic chuck 18 has a structure in which an electrode 20 made of a conductive film is embedded between two insulating layers or two insulating sheets. A DC power supply 22 is electrically connected to the electrode 20. The wafer W is attracted and held on the electrostatic chuck 18 by an electrostatic force such as a Coulomb force generated by a DC voltage applied from the DC power supply 22.

A conductive focus ring (correction ring) 24 made of, e.g., silicon, for improving etching uniformity is provided on a peripheral portion of the susceptor 16 (to surround the periphery of the semiconductor wafer W). A cylindrical inner wall member 26 made of, e.g., quartz, is provided at side surfaces of the susceptor 16 and the susceptor support 14. The inner wall member 26 may be separated to be detachable.

A coolant channel 28 having an annular shape, for example, is provided in the susceptor support 14. A coolant having a predetermined temperature, e.g., cooling water, is supplied to the coolant chamber 28 from an external chiller unit (not shown) through lines 30a and 30b. A processing temperature of the wafer W mounted on the susceptor can be controlled by controlling a temperature of the coolant.

A heat transfer gas, e.g., He gas, from a heat transfer gas supply unit (not shown) is supplied to a gap between a top surface of the electrostatic chuck 18 and a backside of the semiconductor wafer W through a gas supply line 32. The heat transfer gas effectively transfers heat from the semiconductor wafer W, thereby cooling the wafer.

An upper electrode 34 is provided above the susceptor 16 serving as the lower electrode to face the susceptor 16 in parallel. A plasma generation space is defined between the upper electrode 30 and the lower electrode 16. The upper electrode 34 forms a facing surface, i.e., a surface in contact with the plasma generation space while facing the semiconductor wafer W on the susceptor 16 serving as the lower electrode.

The upper electrode 34 is held by an insulating shield 42 at an upper portion of the chamber 10. The upper electrode 34 includes an electrode plate 36 and an electrode holder 38. The electrode plate 36 forms the facing surface to the susceptor 16 and has a plurality of gas injection openings 37. The electrode holder 38 has a water cooling structure and is made of a conductive material, e.g., aluminum. The electrode plate 36 is detachably held by the electrode holder 38. The electrode plate 36 is preferably made of a low-resistance conductor or semiconductor of a low Joule heat. In order to strengthen a photoresist, the electrode plate 36 is preferably made of a material containing silicon, as will be described later. Accordingly, the electrode plate 36 is preferably made of silicon or SiC. A gas diffusion space 40 is provided in the electrode holder 38. A plurality of gas holes 41 extends downward from the gas diffusion space 40 to communicate with the gas injection openings 37. The gas diffusion space 40 is divided into a central portion corresponding to a central portion of the chamber 10 and a peripheral portion corresponding to a peripheral portion of the chamber 10 by, e.g., a partition wall.

Gas inlet openings 62a and 62b are formed at the electrode holder 38 to introduce a processing gas into the gas diffusion space 40. A gas supply line 64a is connected to the gas inlet opening 62a for introducing a gas into a central portion of the gas diffusion space 40. A processing gas supply source 66a is connected to the gas supply line 64a. A flow splitter 68 and an opening/closing valve 70 are provided in that order from the upstream side in the gas supply line 64a. A gas supply line 64b is connected to the gas inlet opening 62b for introducing a gas into a peripheral portion of the gas diffusion space 40. The processing gas supply source 66a and an additional gas supply source 66b are connected to the gas supply line 64b. A mass flow controller (MFC) 69 is provided in the gas supply line 64b. A flow control system (FCS) may be provided instead of the MFC.

As for a processing gas for etching, a fluorocarbon gas ($C_xF_y$), e.g., $C_4F_6$ gas or $C_4F_8$ gas, and He gas are supplied from the processing gas supply source 66a and splitted by the flow splitter 68 into a gas flowing toward the central portion of the gas diffusion space 40 and a gas flowing toward the peripheral portion of the gas diffusion space 40. The gas flowing toward the central portion of the gas diffusion space 40 reaches the central portion of the gas diffusion space 40 through the gas supply line 64a and is injected into the plasma generation space in a shower form through the gas holes 41 and the gas injection openings 37. In other words, the upper electrode 34 functions as a shower head for supplying the processing gas. The gas that is made to flow toward the peripheral portion of the gas diffusion space 40 by the flow splitter 68 among the gas supplied from the additional gas supply source 66b and the gas supplied from the processing gas supply source 66a reaches the peripheral portion of the gas diffusion space 40 and is injected into the plasma generation space.

In the case of using a dilution gas for the processing gas supplied from the processing gas supply source 66a, the amount of helium to be added is preferably, e.g., 35% to 800%, more preferably about 50% to 400% and much more preferably about 70% to 200% of the total flow rate of $C_xF_y$. The flow rate of helium is preferably about 50 sccm to 400 sccm and more preferably about 70 sccm to 200 sccm. When the flow rate of helium is within such a range, it is effective to increase the plasma density.

A first DC power supply 50 is electrically connected to the upper electrode 34 via a low pass filter (LPF) 46a. A cathode of the first DC power supply 50 is connected to the upper electrode 34. The first DC power supply 50 is configured to apply a negative voltage to the upper electrode 34. The LPF 46a traps high frequency powers from a first high frequency power supply and a second high frequency power supply which will be described later. The LFP 46A preferably includes an LR filter or an LC filter.

A cylindrical ground conductor 10a extends upward from the sidewall of the chamber 10 to a position higher than the upper electrode 34. The ground conductor 10a shields an electromagnetic wave.

Figure 2:
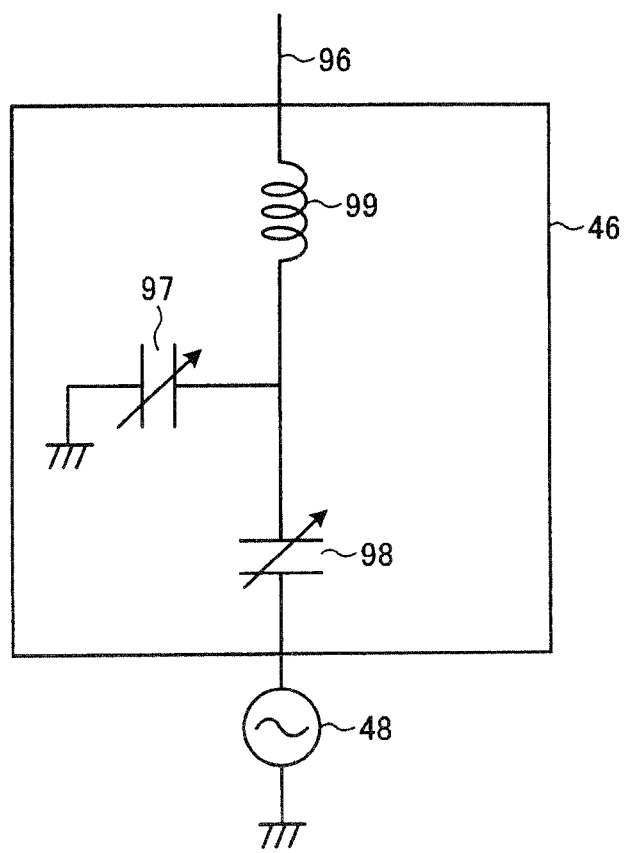
FIG. 2 shows a structure of a first matching unit connected to a first high frequency power supply in the plasma etching apparatus shown in FIG. 1.

The first high frequency power supply 48 for plasma generation is electrically connected to the susceptor 15 serving as the lower electrode via the first matching unit 46. The first high frequency power supply 48 outputs a high frequency power having a high frequency of 27 MHz to 100 MHz, e.g., 40 MHz. The first matching unit 46 for matching a load impedance with an internal (or output) impedance of the first high frequency power supply 48 functions such that the load impedance and the output impedance of the first high frequency power supply 48 apparently match when a plasma is generated in the chamber 10. As shown in FIG. 2, the first matching unit 46 includes: a first variable capacitor 97 branched from a branch point on a power feed line 96 of the first high frequency power supply 46; a second variable capacitor 98 provided between the branch point of the power feed line 96 and the first high frequency power supply 48; and a coil 99 provided opposite to the branch point.

A second high frequency power supply 90 is electrically connected to the susceptor 16 serving as the lower electrode via the second matching unit 88. When the high frequency power is supplied from the second high frequency power supply 90 to the susceptor 16 serving as the lower electrode, a bias is applied to the semiconductor wafer W and ions are attracted to the semiconductor wafer W. The second high frequency power supply 90 outputs a high frequency power having a low frequency ranging from 400 kHz to 13.56 MHz, e.g., 3 MHz. The second matching unit 88 for matching a load impedance with an internal (or output) impedance of the second high frequency power supply 90 functions such that the load impedance including the plasma in the chamber 10 and the internal impedance of the second high frequency power supply 90 apparently match when the plasma is generated in the chamber 10. A dual matcher configuration in which the first matching unit 46 and the second matching unit 88 are formed as one unit may be connected to the susceptor support 14 via a single power feed rod. Accordingly, the unit for performing impedance matching can be scaled down.

The first DC power supply 50, the first high frequency power supply 48, and the second high frequency power supply 90 are electrically connected to and controlled by the pulse controller 95.

Specifically, the pulse controller 95 can control an on/off operation and an output of the first high frequency power supply 48. The pulse controller 95 controls the first high frequency power supply 48 to a plasma generation state obtained by constantly switching ON the first high frequency power supply 48 and a state of alternating a plasma presence state and a plasma absence state by alternately switching on and off the first high frequency power supply 48 in a pulsed manner. In addition, the pulse controller 95 can control an on/off operation and an output of the second high frequency power supply 90 for bias. The pulse controller 95 can control the second high frequency power supply 90 to a state where a bias is constantly applied at a predetermined output during plasma processing and a state where the output of the second high frequency power supply 90 is synchronized with on/off of the first high frequency power supply 48 in a pulsed manner, for example. Further, the pulse controller 95 can perform on/off control of the first DC power supply 50 and current voltage control.

For example, when the first high frequency power supply 48 is in a mode that the high frequency power is switched on/off at a predetermined cycle, the pulse controller 95 controls the first matching unit 46 to perform a matching operation in synchronization with the on/off operation of the first high frequency power supply 48.

In that case, if the variable capacitor cannot follow the on/off operation of the first high frequency power supply 48, the pulse controller 95 controls the first matching unit 46 not to operate. The second matching unit 88 basically has the same configuration as that of the first matching unit 46. Therefore, if the variable capacitor cannot follow the on/off operation of the second high frequency power supply 90, the pulse controller 95 controls the second matching unit 88 not to operate.

However, when the variable capacitors of the first matching unit 46 and the second matching unit 88 operate fast enough, the pulse controller 95 may control the first matching unit 46 to match the load impedance of the first high frequency power supply 48 with the load impedance including the plasma in the chamber 10 and the second matching unit 88 to match the load impedance of the second high frequency power supply 90 with the load impedance including the plasma in the chamber 10.

A gas exhaust port 80 is provided at the bottom portion of the chamber 10, and a gas exhaust unit 84 is connected to the gas exhaust port 80 through a gas exhaust line 82. The gas exhaust unit 84 includes a vacuum pump such as a turbo molecular pump or the like, so that a pressure in the chamber 10 can be decreased to a desired vacuum level. A loading/unloading port 85 for the semiconductor wafer W is provided at the sidewall of the chamber 10. The loading/unloading port 85 can be opened/closed by a gate valve 86. A deposition shield 11 is detachably provided along the inner wall of the chamber 10 to prevent an etching by-product (deposit) from adhering to the chamber 10. In other words, the deposition shield 11 forms a chamber wall. The deposition shield 11 is also provided at an outer periphery of the inner wall member 26. At the bottom portion of the chamber 10, a gas exhaust plate 83 is provided between the deposition shield 11 of the chamber wall side and the deposition shield 11 of the inner wall member 26 side. The deposition shield 11 and the gas exhaust plate 83 may be formed by coating aluminum with ceramic, e.g., $Y_2O_3$ or the like.

A conductive member (GND block) 91, which is DC-connected to the ground, is provided at a portion of the deposition shield 11 which forms the inner wall of the chamber at the substantially same height as the wafer W. With the separation of electrons (charges) from the inner wall surface of the chamber by the conductive member 91, the effect of preventing abnormal discharge is realized. Further, the location of the conductive member 91 is not limited to that shown in FIG. 1 as long as the conductive member 91 is provided in the plasma generation region. For example, the conductive member 91 may be provided at the susceptor 16 side, e.g., at a periphery of the susceptor 16. Further, the conductive member 91 may be provided in a ring shape near the upper electrode 34, e.g., at the outer side of the upper electrode 34. The conductive member 91 may also be provided at a position where it is not exposed to the plasma, e.g., below the susceptor 16.

The respective components of the plasma processing apparatus, e.g., the power supply system, the gas supply system, the driving system, the pulse controller 95 and the like, are connected to and controlled by a control unit (entire control unit) 100 including a microprocessor (computer). A user interface 101 is connected to the control unit 100. The user interface 101 includes a keyboard through which an operator inputs a command to manage the plasma processing apparatus, a display for visualizing and displaying an operation state of the plasma processing apparatus, and the like.

The control unit 100 is also connected to a storage unit 102 for storing a control program for realizing various processes performed in the plasma processing apparatus under the control of the control unit 100, and a program, i.e., a processing recipe, for performing processes of the respective components of the plasma processing apparatus under the processing condition. The processing recipe is stored in a storage medium in the storage unit 102. The storage medium may be a hard disk or a semiconductor memory, or may also be a portable medium such as a CDROM, a DVD, a flash memory or the like. Alternately, a recipe may be properly transmitted from another device via, e.g., a dedicated line.

If necessary, a processing recipe is read out from the storage unit 102 and executed by the control unit 100 in response to an instruction from the user interface 101 or the like, thereby performing a desired process in the plasma processing apparatus under the control of the control unit 100. The plasma processing apparatus (plasma etching apparatus) mentioned in the embodiment includes the control unit 100.

Hereinafter, a plasma etching method according to the first embodiment will be described.

Figure 3A:
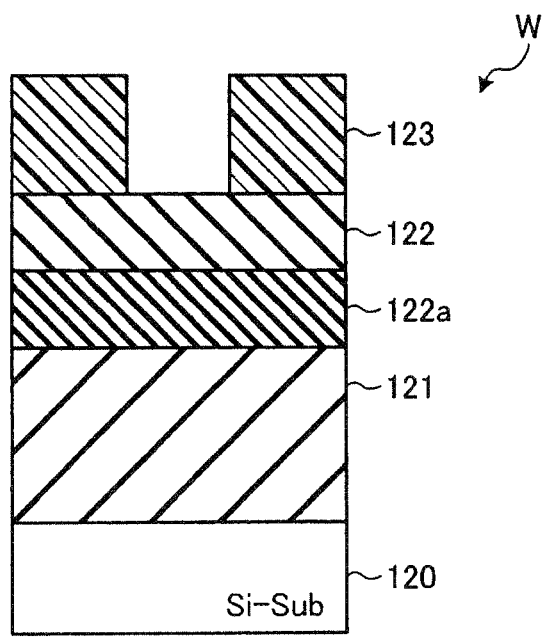
FIGS. 3A to 3C are cross sectional views showing a structure example of a semiconductor wafer as a processing target object to which the plasma etching method according to the first embodiment is applied.

As shown in FIG. 3A, for example, an $SiO_2$ insulating film 121 is formed on a Si substrate 120. Then, a polysilicon film 122a as a hard mask that is an etching mask is formed thereon. Next, an oxide film 122 is formed thereon. Thereafter, a photoresist film (e.g., an ArF resist film) 123 patterned by photolithography is formed thereon as an etching mask.

Figure 3B:
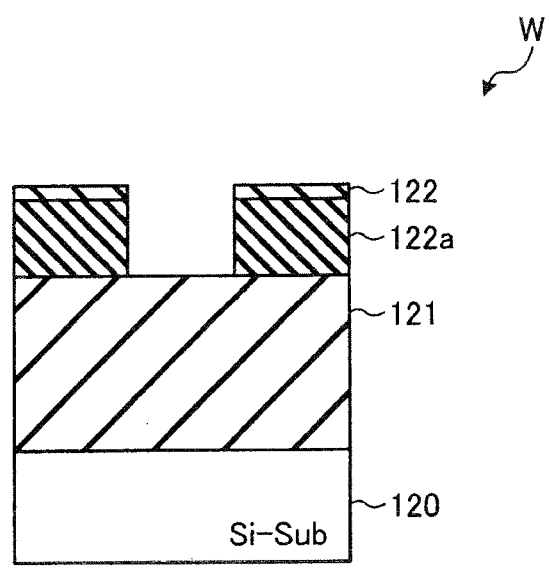

As shown in FIG. 3B, the oxide film 122 is first etched while using the photoresist film 123 as a mask.

Figure 3C:
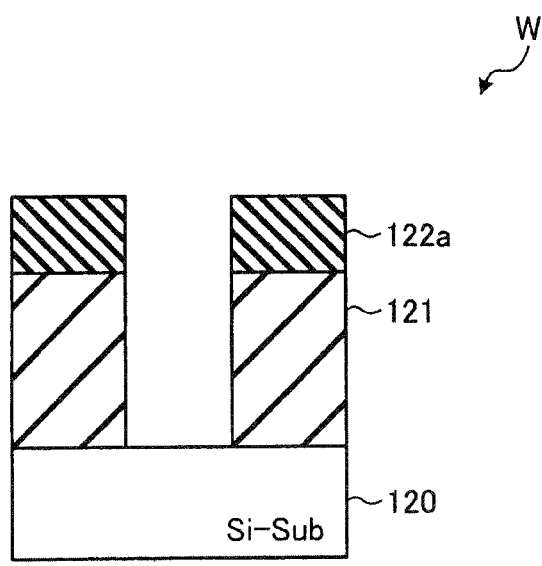

Next, as shown in FIG. 3C, a hard mask is formed by etching the polysilicon film 122a by a plasma of a gas containing a halogen gas, e.g., HBr, $NF_3$ gas or the like, while using the oxide film 122 as a mask.

Then, the semiconductor wafer W on which the hard mask is formed is subjected to plasma etching by the plasma etching apparatus shown in FIG. 1. First, the gate valve 86 is opened and the semiconductor wafer W configured as described above is loaded into the chamber 10 through the loading/unloading port 85 and mounted on the susceptor 16. In that state, the gate valve 86 is closed and the inside of the chamber 10 is exhausted by the gas exhaust unit 84. The processing gas is supplied at a predetermined flow rate from the processing gas supply source 66a into the gas diffusion space 40 and then into the chamber 10 through the gas holes 41 and the gas injection openings 37. A pressure in the chamber 10 is set to, e.g., about 2 Pa (15 mTorr). The wafer W is plasma-etched by applying a predetermined high frequency power and a predetermined DC voltage. At this time, the semiconductor wafer W is fixed onto the electrostatic chuck 18 by supplying a DC voltage from the DC power supply 22 to the electrode 20 of the electrostatic chuck 18. A pressure in the chamber 10 is preferably within a range from about 0.1 Pa to 150 Pa (about 7.5 mTorr to 1125 mTorr), for example. In view of improving etching characteristics, the pressure in the chamber 10 is more preferably within a range from about 1 Pa to 26.6 Pa, for example.

As for the processing gas for etching the insulating film, it is possible to employ a gas containing at least $C_xF_y$ and He gas. $C_xF_y$ may be $C_4F_6$ or $C_4F_8$. One of $C_4F_6$ and $C_4F_8$ may be used, or a mixture of $C_4F_6$ and $C_4F_8$ may be used. The processing gas may additionally contain another gas such as $O_2$ gas, $NF_3$ gas or the like.

<Etching Condition>
Gas type: $C_4F_6/C_4F_8/He/O_2/NF_3$
Gas flow rate: 5-70 sccm (preferably, 25-70 sccm)/5-70 sccm (preferably, 25-70 sccm)/70-200 sccm (preferably, 100-200 sccm)/50-100 sccm/1-20 sccm
Frequency and power of first high frequency power: 40 MHz/1500-2500 W
Frequency and power of second high frequency power: 3 MHz/5000-9000 W
Frequency of high frequency pulse: 1-150 kHz
Duty ratio of high frequency pulse: 10-60%
Off period of high frequency pulse: 30-150 μsec
DC voltage: 500-1000 V A high frequency power for plasma generation which has a relatively high frequency of about 27 MHz to 100 MHz, e.g., 40 MHz, is applied from the first high frequency power supply 48 to the susceptor 16 serving as the lower electrode. Further, a high frequency power for ion attraction which has a frequency of about 400 kHz to 13.56 MHz, e.g., 3 MHz, which is lower than that of the high frequency power for plasma generation is applied from the second high frequency power supply 90 to the susceptor 16. Moreover, a predetermined DC voltage is applied from the first DC power supply 50 to the upper electrode 34.

Figure 12:
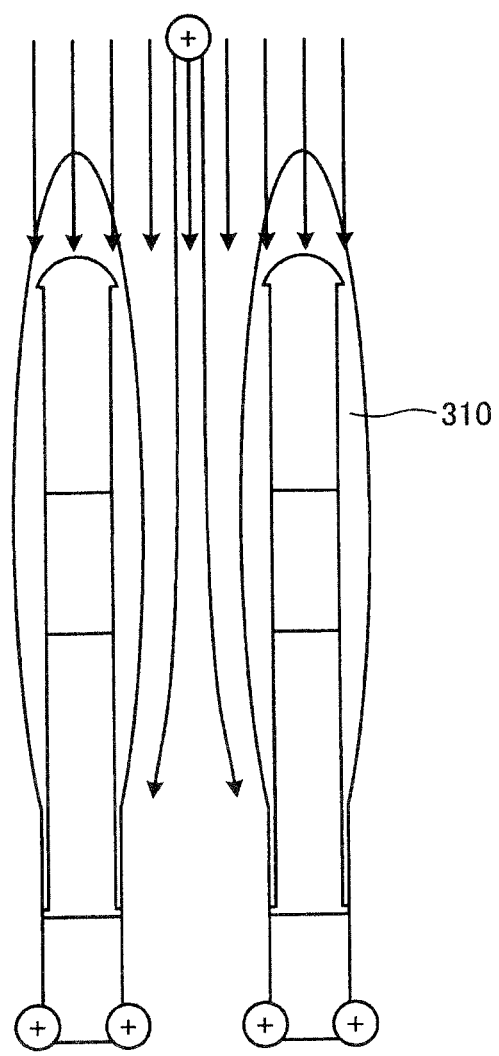
FIG. 12 shows a deposit.

The processing gas containing helium as a dilution gas which is injected through the gas injection openings 37 formed in the electrode plate 36 of the upper electrode 34 is turned into a plasma by the high frequency power between the upper electrode and the susceptor 16 serving as the lower electrode. The insulating film 121 is etched by the plasma thus generated while using the polysilicon 122a as a mask. The insulating film 121 is etched while a CF-based polymer generated from the plasma and a reaction by-product generated from the bottom of the hole are deposited on the inner wall of the hole as a deposit 310 shown in FIG. 12. The deposit serves as a protective film for the sidewall of the hole and suppresses occurrence of bowing (swelling of the hole). However, in the case of forming a hole having a high aspect ratio of, e.g., 20, bowing occurs in the hole and a poor etching shape is obtained, because the protective film is conventionally formed at the upper portion of the hole and has no etching resistance. In this embodiment, the DC voltage is applied to the upper electrode and DC and RF are applied in pulsed manner. Further, the etching is performed by the plasma of the processing gas containing at least $C_xF_y$ and He gas. Therefore, the selectivity between the deposit and the polysilicon can be increased and, accordingly, the bowing can be suppressed. FIG. 12 shows a deposit.

By applying the high frequency power for plasma generation to the lower electrode, the plasma can be generated near the wafer and attracted to the substrate side. Further, the plasma is not diffused and the dissociation of the processing gas can be suppressed, so that the etching rate can be increased even under the condition of a high pressure in the chamber 10 and a low plasma density. Moreover, a relatively high ion energy can be ensured even when the frequency of the high frequency power for plasma generation is high, which is effective. In the present embodiment, since the high frequency power for plasma generation and the high frequency power for ion attraction are independently applied to the lower electrode, it is possible to independently control an ion attraction function and a plasma generation function required for plasma etching. Therefore, the condition of etching that requires high precision for microprocessing can be satisfied. In addition, since the high frequency power for plasma generation which has a high frequency of about 27 MHz or above is supplied, a high-density plasma can be effectively generated under a lower pressure condition.

In the embodiment, helium gas is used. Therefore, when a negative DC voltage is applied from the first DC power supply 50 to the upper electrode 34, positive ions in the plasma collide with the upper electrode 34. As a consequence, the amount of secondary ions generated near the upper electrode 34 becomes relatively greater than that of Ar. Accordingly, the secondary electrons can be accelerated downward in the vertical direction and the accelerated secondary electrons (high-speed electrons) can be supplied into the hole of the semiconductor wafer W as a processing target object. The electrons supplied into the hole of the semiconductor wafer W modify and harden the protective film. In the example shown in FIG. 12, the deposit 310 can be modified and hardened, so that the occurrence of bowing in the hole can be suppressed.

Figure 4:
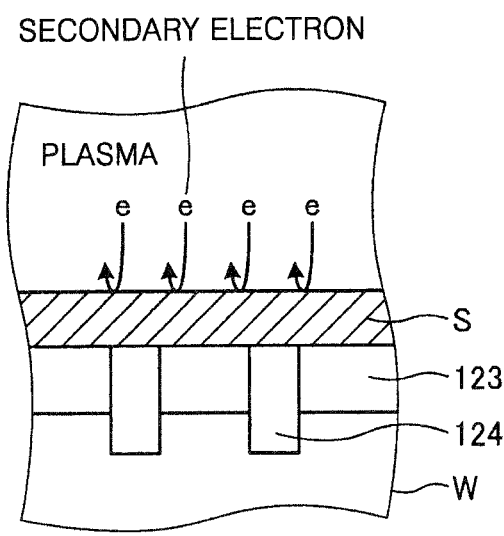
FIG. 4 is a schematic view showing behavior of secondary electrons generated by applying a negative DC voltage to an upper electrode in the case where a plasma sheath is thick.

The modification effect obtained by the high-speed electrons depends on a plasma sheath thickness on the semiconductor wafer W. In other words, during the etching, the high frequency power for bias application is applied from the second high frequency power supply 90 in addition to the high frequency power from the first high frequency power supply 48. Therefore, the plasma sheath thickness S becomes thick as shown in FIG. 4 and the secondary ions "e" are repelled. This inhibits sufficient supply of the electrons to the protective film 123, so that the protective film 123 cannot be sufficiently modified. A reference numeral 124 in FIG. 4 indicates a contact hole.

Figure 5:
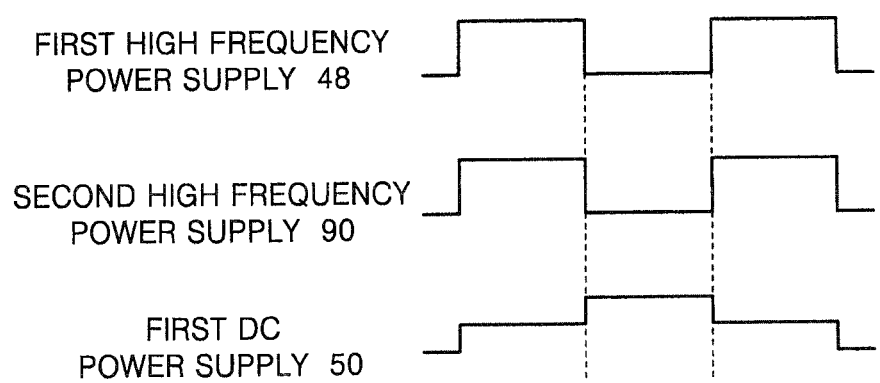
FIG. 5 is a timing chart showing states of a first high frequency power supply, a second high frequency power supply and a first DC power supply in the plasma etching method according to the first embodiment.
Figure 6:
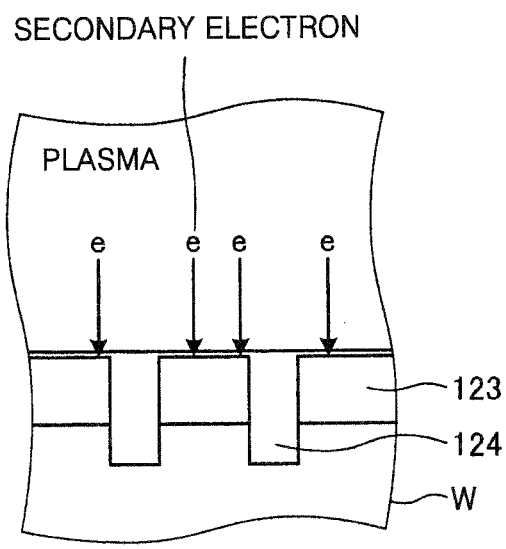
FIG. 6 is a schematic view showing behavior of secondary electrons generated by applying a negative DC voltage to the upper electrode in the case where a plasma sheath does not exist.

Therefore, in the present embodiment, the first high frequency power 48 for plasma generation is alternately switched on and off and the second high frequency power 90 for bias application is alternately switched on and off in synchronization with the on/off operation of the first high frequency power 48 for plasma generation, as shown in FIG. 5. Further, as shown in FIG. 6, the state where a plasma (glow plasma) is generated (plasma on) by the first high frequency power supply 48 and the state where a plasma is extinguished (plasma off) are alternately repeated and a negative DC voltage is applied from the first DC power supply 50 to the upper electrode 34 in synchronization with the on/off state of the plasma such that an absolute value of the application voltage becomes greater in the plasma off period than in the plasma on period.

In other words, when the plasma processing proceeds, a plasma sheath generated by the first high frequency power supply 48 and a plasma sheath generated by the second high frequency power supply 90 for bias application are combined, thereby forming a considerably thick plasma sheath. Therefore, in the plasma on period, the secondary electrons "e" are reflected by the plasma sheath S without being supplied to the protective film, which results in insufficient modification of the protective film. However, in the plasma off period, both of the first high frequency power supply 48 and the second high frequency power supply 90 are switched off, so that the plasma sheath disappears almost completely. Accordingly, as shown in FIG. 6, the secondary electrons (high-speed electrons) "e" can easily reach the protective film. As a result, the protective film can be effectively modified (hardened).

Since the DC voltage from the first DC power supply 50 is applied such that the absolute value thereof becomes greater in the plasma off period than in the plasma on period, a large amount of electrons are supplied to the protective film during the plasma off period. Accordingly, the protective film can be more effectively modified (hardened).

Figure 7:
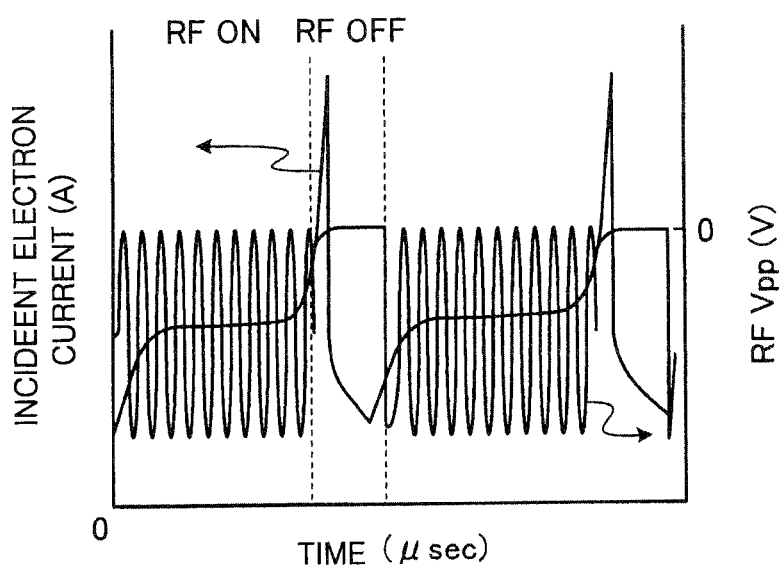
FIG. 7 is a graph showing relation between on/off of a high frequency power and an incident electron current on a wafer in the plasma etching method according to the first embodiment.

FIG. 7 shows relation between the on/off state of the plasma in accordance with the on/off state of the high frequency (RF) power and an incident electron current A to the semiconductor wafer W which indicates the amount of electrons incident on the semiconductor wafer W. As can be seen from FIG. 7, the incident electron current is increased in the plasma off period obtained by switching off the high frequency (RF) power. This indicates that a large amount of electrons are supplied in the plasma off period.

A DC voltage applied in the plasma on period may be set to a level suitable for a plasma to be formed, e.g., about 0V to 2000V. A DC voltage applied in the plasma off period preferably has an absolute value greater than that of a DC voltage applied in the plasma on period. In view of modifying the photoresist film 123 or the like, a larger absolute value is preferred and an upper limit thereof does not exist. However, in view of the durability of the apparatus, it is preferable that the absolute value thereof is smaller than about −2000V. Specifically, it is preferably about −300V to −1500V and more preferably about −500V to −1000V.

The plasma off period is preferably about 30 μsec to 150 μsec. When the plasma off period is shorter than about 30 μsec, the incident amount of secondary electrons is small and, thus, the modification becomes insufficient and bowing cannot be suppressed. Therefore, a longer plasma off period is preferred. A pulse frequency is preferably about 1 kHz to 15 kHz and more preferably about 5 kHz to 15 kHz. A duty ratio is preferably about 10% to 60%. When the duty ratio is greater than or equal to about 60%, a poor etching shape is obtained. Therefore, a lower duty ratio is preferred.

Figure 8:
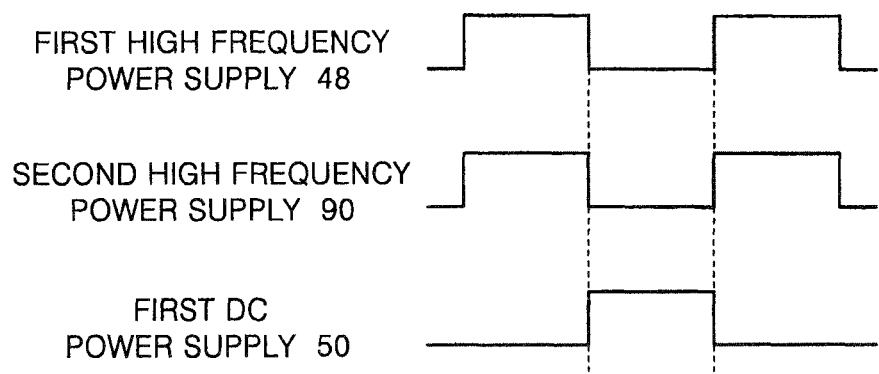
FIG. 8 is a timing chart showing another example of the states of the first high frequency power supply, the second high frequency power supply and the first DC power supply in the plasma etching method according to the first embodiment.

As shown in FIG. 8, the DC voltage from the first DC power supply 50 may be switched off in the plasma on period and switched on in the plasma off period.

In the present embodiment, a high Vpp process requires Vpp of about 3000V to 4000V and Vdc of about −1500V to −2000V. On the assumption that Vdc of the upper electrode is set to "Vdc(top)" and Vdc of the lower electrode is set to "Vdc(bottom)", the condition of Vdc(top)>Vdc(bottom) needs to be satisfied in order to obtain the effect of modifying the protective film.

Figure 9:
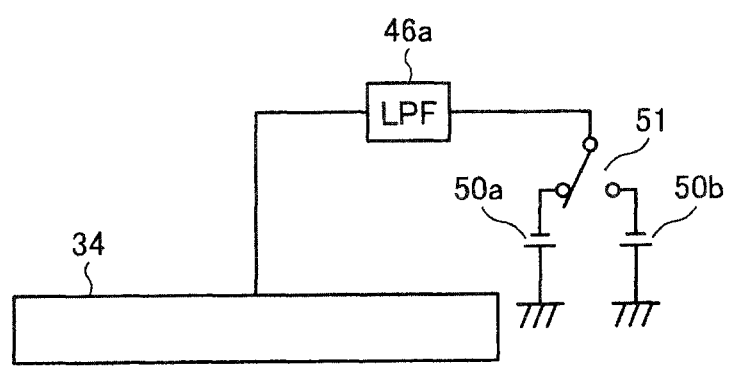
FIG. 9 is a schematic view showing another example of the first DC power supply of the apparatus shown in FIG. 1.

As for an apparatus for performing the method of the present embodiment, there can be used, instead of the apparatus shown in FIG. 1, an apparatus shown in FIG. 9 which includes a low voltage application DC power supply 50a for applying a relatively low DC voltage in the plasma on period and a high voltage application DC power supply 50b for applying a relatively high DC voltage in the plasma off period. The DC power supplies 50a and 50b are alternately switched by a switch 51, so that a DC voltage can be more easily switched.

As for the dilution gas, a rare gas having a mass lighter than Ar gas, e.g., helium gas, neon gas or the like, may be used. Here, the case of using another rare gas as a dilution gas will be used for comparison. The effect of modifying the organic film can be improved by high-speed secondary electrons generated by the rare gas. In other words, the secondary electrons are generated near the upper electrode 34 by collision between positive ions in the plasma and the upper electrode 34. Here, secondary electron emission coefficient (SEEC) of gases that may be used as a rare gas are examined. For example, when ions collided with Si(100) at an acceleration voltage of about 100 eV, the SEECs of Ar+, Ne+ and He+ were about 3%, 13% and 17%, respectively. From the above, it is preferable to use a rare gas having a smaller mass than that of Ar gas, such as neon gas, helium gas or the like which has a relatively high SEEC. More preferably, helium gas is used.

The following is description on a test that has examined the effect of the method of the present embodiment. There was prepared a sample obtained by forming the $SiO_2$ insulating film 121 with a thickness of about 3000 nm on a silicon substrate, forming the polysilicon film 122a as a mask with a thickness of about 900 nm thereon, and forming the ArF resist film 123 patterned by photolithography thereon. In this sample, a thickness of the residual polysilicon film 122a was measured in the case of etching the $SiO_2$ insulating film 121 by switching on and off the first high frequency power supply 48 and the second high frequency power supply 90 in synchronization with each other and consecutively applying a DC voltage of −150V from the first DC power supply 50 to the upper electrode while maintaining the absolute value thereof at a lower level and in the case of etching the $SiO_2$ insulating film 121 by applying a DC voltage of −1200V with an increased absolute value while switching off the first high frequency power supply 48 and the second high frequency power supply 90. In other words, when the ArF resist film 123 that is an organic film and the polysilicon film 122*a* have high strength, the ArF resist film 123 remains for a long period of time during the plasma etching and the thickness of the residual polysilicon film 122*a* is large due to the high etching resistance of the polysilicon film 122*a*.

According to the test result, when the etching process was performed by consecutively applying a DC voltage at a constant level, the thickness of the residual polysilicon film 122*a* was 430 nm. However, when a DC voltage was applied in a pulsed manner as in the present embodiment, the thickness of the residual polysilicon film 122*a* was 485 nm. From the above, it is clear that the ArF resist film 123 and the polysilicon film 122*a* have high strength in the present embodiment.

In the case of forming a contact hole having a high aspect ratio by using helium as a dilution gas, the generation of bowing can be suppressed compared to the case of using another dilution gas.

Figure 10A:
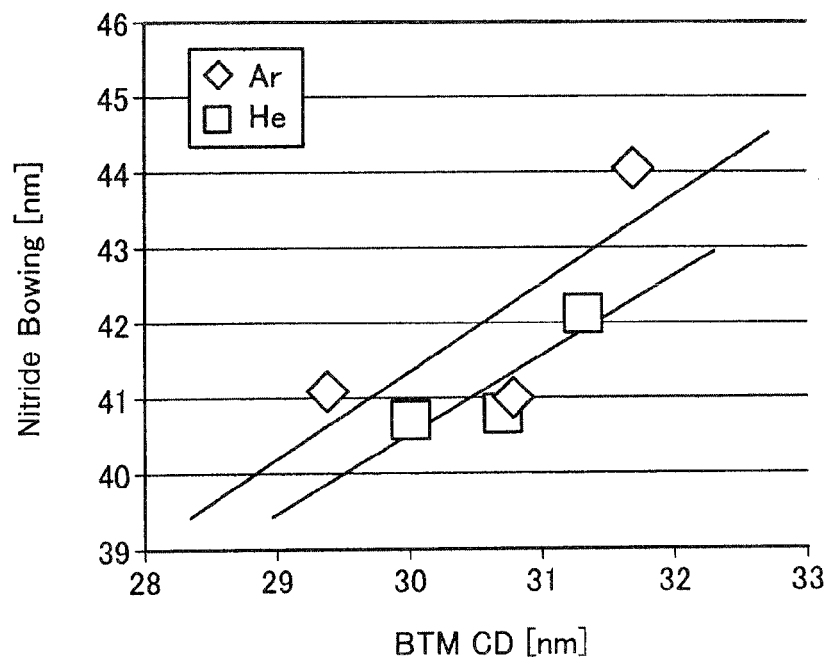
FIGS. 10A and 10B compare the case of using helium gas as a dilution gas and the case of using argon gas as a dilution gas.
Figure 10B:
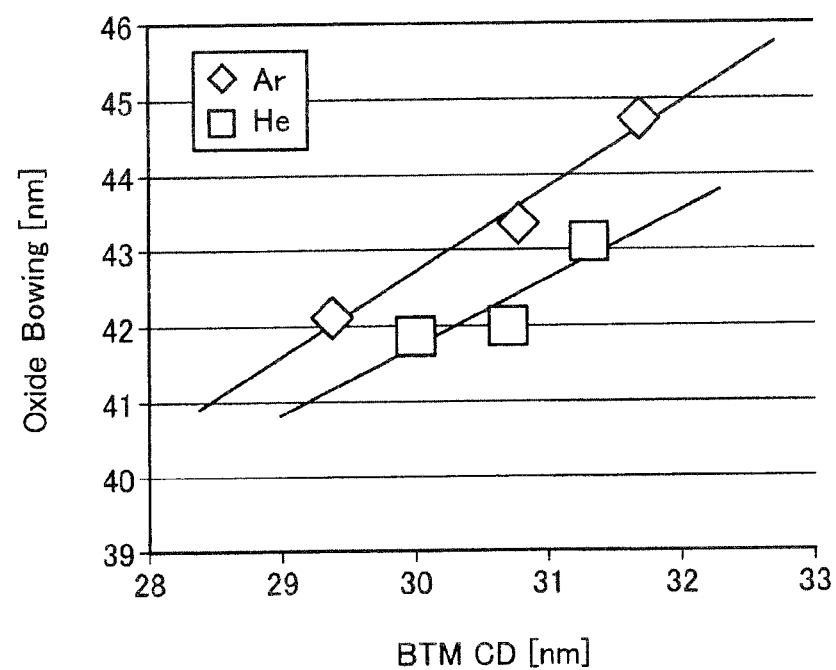

FIGS. 10A and 10B show relation between bowing and a bottom CD in a hole in the case of using helium gas as a dilution gas and in the case of using argon gas as a dilution gas under the above-described processing condition. The data shown in FIGS. 10A and 10B were obtained in a predetermined laminated film which was formed by laminating a first SiN layer, a first SiO$_2$ layer, a second SiN layer, a second SiO$_2$ layer, a third SiN layer, and a polymask layer on a silicon substrate in that order with predetermined thicknesses. Then, the case of performing etching by using argon as a dilution gas and the case of performing etching by using helium as a dilution gas were compared. Specifically, the poly mask layer, the third SiN layer, the second SiO$_2$ layer, and the second SiN layer were etched in that order. Next, the first SiO$_2$ layer was etched by using a processing gas containing helium gas as a dilution gas or a processing gas containing argon gas as a dilution gas. Thereafter, a bowing width was measured.

In FIGS. 10A and 10B, the horizontal axis represents a width of a bottom portion of a contact hole and the vertical axis represents a largest width of the contact hole in the second SiN layer. As shown in FIGS. 10A and 10B, when the etching was performed by applying DC and RF in pulsed manner, the bowing width was reduced by about 1 nm in the case of using helium as a dilution gas compared to the case of using argon as a dilution gas. In other words, it was possible to suppress the occurrence of bowing by using helium.

The bowing can be suppressed by performing first plasma etching by a plasma of a processing gas containing Ar gas as a dilution gas in the case of etching the second SiO$_2$ layer formed at an upper portion and performing second plasma etching by a plasma of a processing gas containing He gas as a dilution gas in the case of etching the first SiO$_2$ layer formed at a lower portion.

The ratio of the high frequency power having a high frequency between the first plasma etching and the second plasma etching is preferably about 1:15 to 1:2.5. The ratio of the high frequency power having a low frequency between the first plasma etching and the second plasma etching is preferably about 1:1 to 1:1.5.

In the first plasma etching, a DC voltage applied to the upper electrode is preferably about −100V to −400V when the pulse is on and about −800V to −1000V when the pulse is off.

In the second plasma etching, a DC voltage applied to the upper electrode is preferably about −400V to −600V when the pulse is on and about −900V to −1100V when the pulse is off.

Other Embodiments

Figure 11A:
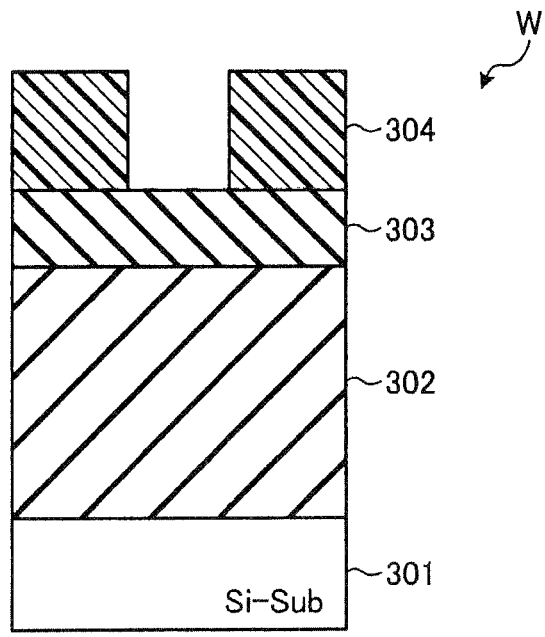
FIGS. 11A to 11C show another example of a processing target object.
Figure 11B:
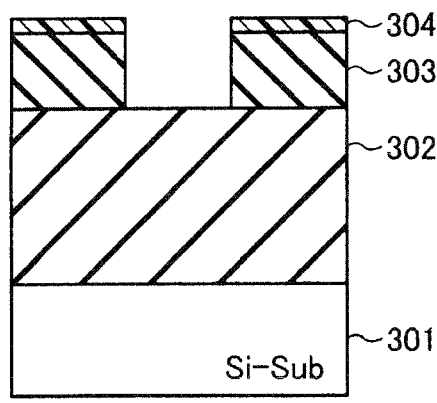
Figure 11C:
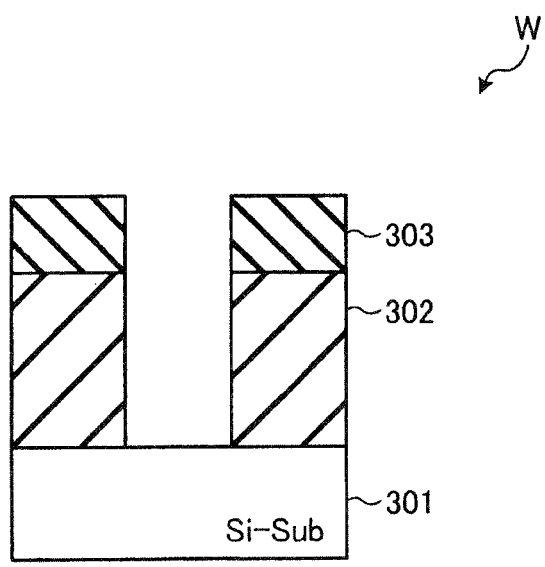

While the embodiments have been described, the disclosure may vary without being limited to the above embodiments. For example, the apparatus for implementing the present invention is not limited to the above-described apparatus and may be an apparatus in which only one high frequency power for plasma generation is applied to the lower electrode. Although a first DC voltage is applied during the plasma etching in the above embodiments, it is not necessary. A processing target object to which the present invention is applied is not limited to that shown in FIG. 3 and may be another processing target object. For example, there may be used a processing target object in which an antireflection film is formed between a photoresist and an etching target film. The etching target film is typically an insulating film such as an oxide film or the like. However, the etching target film is not limited thereto. FIGS. 11A to 11C show another example of the processing target object. The processing target object may be a semiconductor wafer W having a structure shown in FIG. 11A, for example. Specifically, an insulating film 302 is formed on a Si substrate 301; an amorphous carbon film 303, e.g., an organic film, is formed as a hard mask that is an etching mask thereon; and a photoresist film (e.g., ArF resist film) 304 patterned by photolithography is formed as an etching mask thereon. The amorphous carbon film 303 is first etched while using the photoresist film 304 as a mask as shown in FIG. 11B. Thereafter, the insulating film 302 is etched by a C$_x$F$_y$-based gas while using the amorphous carbon film 303 as a mask, thereby forming a via trench, as shown in FIG. 11C.

While the disclosure has been shown and described with respect to the embodiments, it will be understood by those skilled in the art that various changes and modifications may be made without departing from the scope of the disclosure as defined in the following claims.

What is claimed is:

1. A plasma etching method for forming a hole in an etching target film by using a plasma etching apparatus including: an evacuable processing chamber configured to accommodate a processing target object; a lower electrode, provided in the processing chamber, serving as a mounting table for the processing target object; an upper electrode provided in the processing chamber to face the lower electrode; a processing gas supply unit configured to supply a processing gas containing at least C$_x$F$_y$ gas and a rare gas having a mass smaller than a mass of Ar gas into the processing chamber; a high frequency power application unit configured to apply a high frequency power for plasma generation to at least one of the upper electrode and the lower electrode; and a DC power supply configured to apply a negative DC voltage to the upper electrode, the method comprising:

etching the etching target film to form a hole therein by alternately repeating a process of generating a plasma of the processing gas supplied into the processing chamber by switching on the high frequency power application unit under a first condition and a process of extinguishing the plasma of the processing gas in the processing chamber by switching off the high frequency power application unit under a second condition, and applying the negative DC voltage from the DC power supply such that an absolute value of the negative DC voltage of the second condition becomes greater than an absolute value of the negative DC voltage of the first condition.

2. A plasma etching method for forming a hole in a first insulating layer and a second insulating layer by using a plasma etching apparatus including: an evacuable processing chamber configured to accommodate a processing target object having a laminated film obtained by alternately laminating a first insulating layer and a second insulating layer and a mask layer formed on the first insulating layer; a lower electrode, provided in processing chamber, serving as a mounting table for the processing target object; an upper electrode provided in the processing chamber to face the lower electrode; a processing gas supply unit configured to supply a processing gas containing at least a $C_xF_y$ gas and a rare gas having a smaller mass than a mass of Ar gas into the processing chamber; a high frequency power application unit configured to apply a high frequency power for plasma generation to at least one of the upper electrode and the lower electrode; and a DC power supply for applying a negative DC voltage to the upper electrode, the method comprising:
- a first plasma etching step of etching the first insulating layer by a first plasma; and
- a second plasma etching step of etching the second insulating layer by a second plasma,
- wherein the second plasma etching step includes:
- etching the second insulating layer to form a hole therein by alternately repeating a process of generating a plasma of the processing gas supplied into the processing chamber by switching on the high frequency power application unit under a first condition and a process of extinguishing the plasma of the processing gas in the processing chamber by switching off the high frequency power application unit under a second condition, and applying the negative DC voltage from the DC power supply such that an absolute value of the negative DC voltage of the second condition becomes greater than an absolute value of the negative DC voltage of the first condition.

3. The plasma etching method of claim 1, wherein the $C_xF_y$ gas is $C_4F_6$ gas or $C_4F_8$ gas, and the processing gas contains at least one of the $C_4F_6$ gas and the $C_4F_8$ gas.

4. The plasma etching method of claim 2, wherein the $C_xF_y$ gas is $C_4F_6$ gas or $C_4F_8$ gas, and the processing gas contains at least one of the $C_4F_6$ gas and the $C_4F_8$ gas.

5. The plasma etching method of claim 1, wherein the processing gas further contains $O_2$ gas.

6. The plasma etching method of claim 2, wherein the processing gas further contains $O_2$ gas.

7. The plasma etching method of claim 1, wherein the processing gas further contains $NF_3$ gas.

8. The plasma etching method of claim 2, wherein the processing gas further contains $NF_3$ gas.

9. The plasma etching method of claim 1, wherein a rare gas having a mass smaller than a mass of the Ar gas is He gas or Ne gas.

10. The plasma etching method of claim 2, wherein a rare gas having a mass smaller than a mass of the Ar gas is He gas or Ne gas.

* * * * *